United States Patent
Dumont et al.

(10) Patent No.: US 10,710,339 B2
(45) Date of Patent: *Jul. 14, 2020

(54) HEATING GLAZING UNIT

(71) Applicant: AGC GLASS EUROPE, Louvain-la-Neuve (BE)

(72) Inventors: Jacques Dumont, Bioul (BE); Peter Masschelein, Huldenberg (BE); Jean-Michel Depauw, Brussels (BE)

(73) Assignee: AGC GLASS EUROPE, Louvain-la-Neuve (BE)

( * ) Notice: Subject to any disclaimer, the term of this patent is extended or adjusted under 35 U.S.C. 154(b) by 0 days.

This patent is subject to a terminal disclaimer.

(21) Appl. No.: 15/328,565

(22) PCT Filed: Jul. 15, 2015

(86) PCT No.: PCT/EP2015/066133
§ 371 (c)(1),
(2) Date: Jan. 24, 2017

(87) PCT Pub. No.: WO2016/012323
PCT Pub. Date: Jan. 28, 2016

(65) Prior Publication Data
US 2017/0210096 A1    Jul. 27, 2017

(30) Foreign Application Priority Data
Jul. 25, 2014   (EP) .................................... 14178590

(51) Int. Cl.
*C03C 17/36* (2006.01)
*B32B 17/10* (2006.01)
(Continued)

(52) U.S. Cl.
CPC .. *B32B 17/10036* (2013.01); *B32B 17/10174* (2013.01); *B32B 17/10183* (2013.01);
(Continued)

(58) Field of Classification Search
CPC ............ C03C 17/3649; C03C 17/3684; C03C 2217/72; C03C 17/3639
See application file for complete search history.

(56) References Cited

U.S. PATENT DOCUMENTS 3,272,986 A * 9/1966 Schmidt .................. F24S 70/25
136/206
4,725,710 A * 2/1988 Ramus .............. B32B 17/10174
219/203
(Continued)

FOREIGN PATENT DOCUMENTS

EP  0 997 266 A1   5/2000
JP  08048545 A *  2/1996 ......... C03C 17/3435
(Continued)

OTHER PUBLICATIONS

Machine translation of WO 2012/095380 A1, obtained from Espacenet (Year: 2018).*

(Continued)

*Primary Examiner* — Z. Jim Yang
(74) *Attorney, Agent, or Firm* — Oblon, McClelland, Maier & Neustadt, L.L.P.

(57) ABSTRACT

A laminated automotive glazing unit including two glass sheets joined by a thermoplastic interlayer sheet, a system of conductive layers applied to one of the sheets, and including on an edge of the same sheet a substantially opaque masking strip, making contact with the glass sheet, the system of conductive layers covering at least partially the masking strip. The glazing unit further includes busbars for supplying electrical power, the busbars making contact with the layer system in the portion covering the masking strip. The masking strip includes a set of layers that absorb visible radiation, the layers being formed by cathodic sputtering.

18 Claims, 1 Drawing Sheet

(51) Int. Cl.
  *H05B 3/06* (2006.01)
  *H05B 3/84* (2006.01)
  *C23C 14/34* (2006.01)
  *B60J 1/00* (2006.01)

(52) U.S. Cl.
  CPC .. *B32B 17/10293* (2013.01); *B32B 17/10348* (2013.01); *C23C 14/34* (2013.01); *H05B 3/06* (2013.01); *H05B 3/84* (2013.01); *B60J 1/001* (2013.01); *H05B 2203/011* (2013.01)

(56) References Cited

U.S. PATENT DOCUMENTS

| | | | | |
|---|---|---|---|---|
| 4,865,713 | A * | 9/1989 | Kohlhase | C23C 14/568 204/298.07 |
| 4,902,581 | A * | 2/1990 | Criss | C03C 17/36 428/627 |
| 5,270,517 | A | 12/1993 | Finley | |
| 5,566,011 | A * | 10/1996 | Steigerwald | G02F 1/133512 349/110 |
| 5,688,585 | A * | 11/1997 | Lingle | C03C 17/36 428/216 |
| 5,714,268 | A * | 2/1998 | Anderson | C03C 17/09 359/360 |
| 5,939,201 | A * | 8/1999 | Boire | C03C 17/002 359/839 |
| 6,159,607 | A * | 12/2000 | Hartig | C03C 17/3435 428/426 |
| 6,285,424 | B1 * | 9/2001 | Yoshida | G02B 5/201 349/110 |
| 6,335,142 | B1 * | 1/2002 | Quesnel | G02B 5/22 430/271.1 |
| 6,495,261 | B1 | 12/2002 | Gagliardi et al. | |
| 6,650,478 | B1 * | 11/2003 | DeBusk | C03C 17/36 359/359 |
| 7,041,376 | B2 * | 5/2006 | Shimatani | C03C 17/3435 428/432 |
| 2002/0192473 | A1 * | 12/2002 | Gentilhomme | C03C 17/3435 428/432 |
| 2003/0017316 | A1 * | 1/2003 | Pfaff | A61K 8/19 428/212 |
| 2003/0116551 | A1 * | 6/2003 | Sol | B32B 17/10036 219/203 |
| 2003/0170449 | A1 * | 9/2003 | Kloppel | C23C 14/086 428/336 |
| 2004/0053068 | A1 * | 3/2004 | Schicht | C03C 17/36 428/627 |
| 2004/0161616 | A1 * | 8/2004 | Neuman | C03C 17/3435 428/432 |
| 2004/0214014 | A1 * | 10/2004 | Lin | C03C 17/225 428/426 |
| 2005/0172829 | A1 * | 8/2005 | Shimatani | C03C 17/06 99/403 |
| 2005/0238885 | A1 * | 10/2005 | Takeda | C09D 11/03 428/426 |
| 2006/0018050 | A1 * | 1/2006 | Okami | G02B 5/22 359/888 |
| 2006/0088773 | A1 * | 4/2006 | Bellman | C03C 17/36 430/5 |
| 2006/0110587 | A1 * | 5/2006 | Okami | G02B 5/205 428/216 |
| 2006/0159933 | A1 * | 7/2006 | Disteldorf | C03C 17/3435 428/432 |
| 2007/0166630 | A1 * | 7/2007 | Kim | C03C 17/36 430/5 |
| 2007/0196670 | A1 * | 8/2007 | Barshilia | C23C 14/568 428/446 |
| 2008/0173535 | A1 * | 7/2008 | Krempel-Hesse | C23C 14/3407 204/192.12 |
| 2008/0213555 | A1 * | 9/2008 | Ono | C23C 14/0036 428/215 |
| 2008/0264931 | A1 * | 10/2008 | Vilato | C03C 17/00 219/622 |
| 2009/0051860 | A1 * | 2/2009 | Hiruma | G02B 5/003 349/106 |
| 2009/0257141 | A1 * | 10/2009 | Yamada | B60J 1/00 359/893 |
| 2010/0035034 | A1 * | 2/2010 | Yin | C23C 14/0676 428/216 |
| 2010/0255294 | A1 * | 10/2010 | Yaoita | C03C 17/3435 428/336 |
| 2010/0264130 | A1 * | 10/2010 | Ikegami | C03C 17/36 219/620 |
| 2011/0027554 | A1 * | 2/2011 | Gouardes | C03C 17/36 428/213 |
| 2011/0039113 | A1 * | 2/2011 | Ono | C03C 8/14 428/428 |
| 2011/0146172 | A1 * | 6/2011 | Mauvernay | C03C 17/3435 52/235 |
| 2012/0125314 | A1 * | 5/2012 | Alonso Esteban | C03C 17/36 126/211 |
| 2012/0164443 | A1 * | 6/2012 | Durandeau | C03C 17/3435 428/336 |
| 2012/0177899 | A1 * | 7/2012 | Unquera | C03C 17/36 428/213 |
| 2012/0225304 | A1 * | 9/2012 | Imran | C03C 17/36 428/433 |
| 2013/0056135 | A1 | 3/2013 | Dixon et al. | |
| 2013/0120842 | A1 * | 5/2013 | Moens | C03C 17/36 359/585 |
| 2013/0215067 | A1 * | 8/2013 | Hwang | G02B 5/003 345/173 |
| 2014/0017472 | A1 * | 1/2014 | Coster | B32B 17/10036 428/219 |
| 2014/0063582 | A1 * | 3/2014 | Gross | G02B 5/208 359/241 |
| 2014/0091082 | A1 * | 4/2014 | Alaman Aguilar | H05B 6/062 219/622 |
| 2014/0144426 | A1 * | 5/2014 | Cespedes Montoya | C23C 28/321 126/694 |
| 2014/0197152 | A1 * | 7/2014 | Alonso Esteban | C03C 17/36 219/452.12 |
| 2014/0319116 | A1 * | 10/2014 | Fischer | H05B 3/84 219/203 |
| 2014/0335349 | A1 * | 11/2014 | Henn | C03C 17/002 428/332 |
| 2014/0362434 | A1 * | 12/2014 | Schmitz | H05B 3/84 359/350 |
| 2015/0062709 | A1 * | 3/2015 | Matsuyuki | C03C 17/3417 359/584 |
| 2015/0064432 | A1 * | 3/2015 | Matsuyuki | G02B 1/115 428/216 |
| 2015/0125691 | A1 * | 5/2015 | Mahieu | C03C 17/36 428/336 |
| 2015/0329414 | A1 * | 11/2015 | De Grazia | C03C 17/3618 428/216 |
| 2016/0002101 | A1 * | 1/2016 | Mahieu | C03C 17/3618 359/359 |
| 2016/0070033 | A1 * | 3/2016 | Schlott | C23C 14/08 428/216 |
| 2016/0145151 | A1 * | 5/2016 | Mahieu | C03C 17/3618 428/213 |
| 2016/0354995 | A1 * | 12/2016 | Lienhart | B32B 15/04 |
| 2017/0088461 | A1 * | 3/2017 | Tavares-Cortes | C03C 17/36 |
| 2018/0223418 | A1 * | 8/2018 | Schlott | C03C 17/36 |

FOREIGN PATENT DOCUMENTS

| | | | | |
|---|---|---|---|---|
| JP | | 2009157211 A * | 7/2009 | G02B 5/22 |
| WO | | 2004/082934 A1 | 9/2004 | |
| WO | | 2011/131958 A1 | 10/2011 | |
| WO | | 2012/095380 A1 | 7/2012 | |
| WO | | WO-2012140098 A1 * | 10/2012 | B32B 17/10036 |
| WO | | WO-2013104438 A1 * | 7/2013 | H05B 3/84 |

(56) References Cited

FOREIGN PATENT DOCUMENTS

| WO | WO-2014063953 A2 | * | 5/2014 | ......... C03C 17/3435 |
| WO | WO-2015052440 A1 | * | 4/2015 | ............ C03C 17/36 |

OTHER PUBLICATIONS

NPL on refractive index of alumina, obtained from http://www.htelabs.com/virtual_fab/pvd_sputtering_deposition/al2o3_aluminum_oxide_pvd_sputter_deposition_physical_vapor_deposition_sputtering.htm (Year: 2018).*

International Search Report dated Oct. 19, 2015 in PCT/EP2015/066133 filed Jul. 15, 2015.

\* cited by examiner

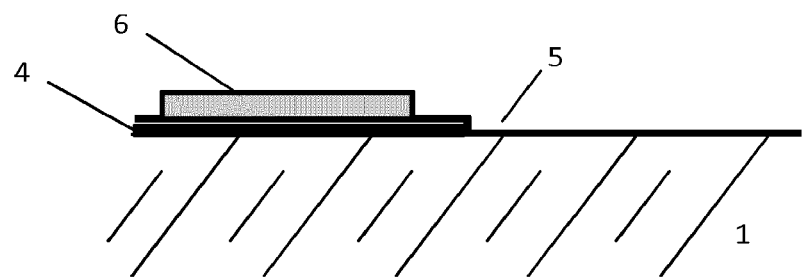
Fig.1
Fig.2
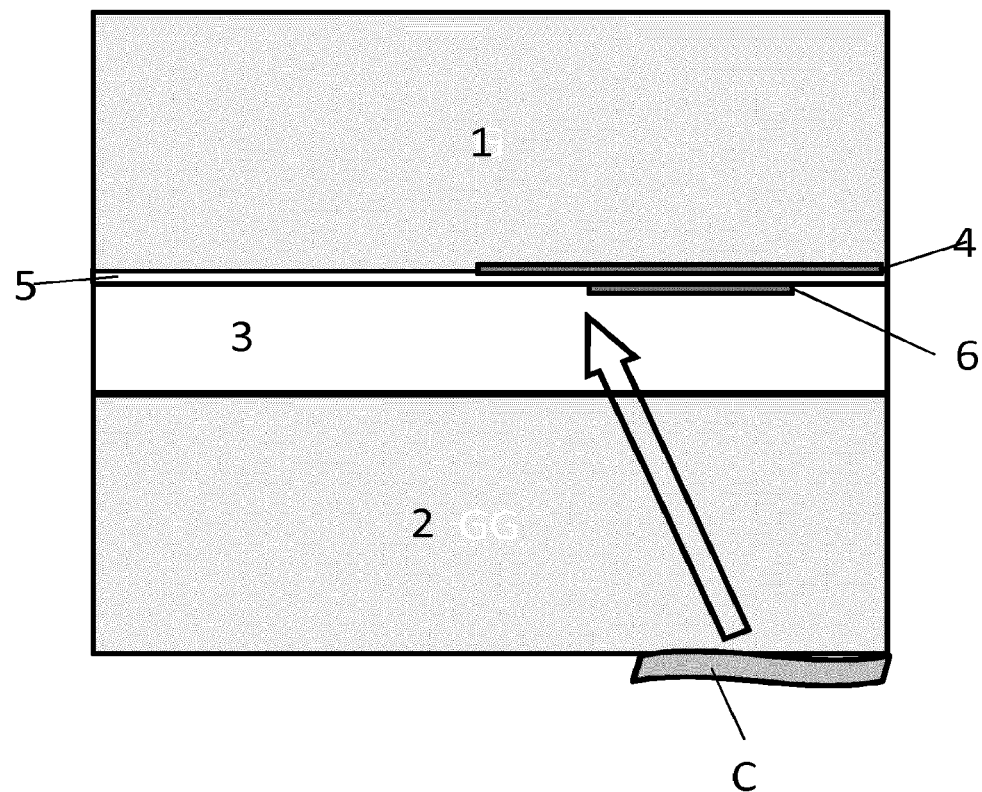

HEATING GLAZING UNIT

The invention relates to motor vehicle glass panels comprising a system of conductive layers which is intended to heat the glass panel. More specifically, the invention relates to the improvement in the performance of these glass panels by the conditions under which the system of layers is powered.

In practice, layered heated glass panels are connected to the electrical supply by means of conductors applied to the edges of the glass panel and in contact with the layers. In practice, the electrical contact between the conductors in question, which are denoted under the name of busbars, and the system of layers is not always provided under the best conditions. The irregularities in this contact have, as consequence, a distribution of the power which is not optimized, on the one hand, and, on the other hand, the formation of favored regions for the passage of the current, creates what is denoted under the name of "hot spots". Even if the latter remain within temperatures which can be endured by the materials used in forming the glass panel, the nonhomogeneous distribution of the electric power limits the performances achieved.

Under the most usual conditions, as the voltage which can be applied is limited—most generally to 12-14 V for private vehicles—and it is not possible for the resistance of the layers to be lowered for reasons related to the light transmission of these glass panels and to their color in reflection, the effective power available is limited. It is necessary to move nearer to conditions which are targeted at devoting virtually all of this power to the heating of the glass panel. Any loss of power, in particular at the interface of the busbars and the conductive layers, limits the heating performances. This loss of power is particularly troublesome for the glass panels exhibiting the greatest dimensions. In vehicles, the glass panels making the greatest demands are the windshields. Subsequently, the invention is described with reference to windshields, it being understood that the proposals also apply to glass panels of more modest dimensions.

The heated glass panels, apart from the layers and busbars, most generally comprises means intended to mask unsightly elements located behind these glass panels. For glued glass panels, the irregular bead of glue would be visible from the outside, unless the corresponding region of gluing necessarily located on the edge of the glass panel was rendered opaque. The busbars are also among the elements that should be hidden from view from the outside of the vehicle.

The masking of the edges of the glass panel is conventionally carried out by application of an enamel composition which renders this region of the glass panel in practice completely opaque. The light transmission in the coated region of this enamel is, for example, less than 1% and can usually be less than 0.1% of the incident light.

Generally, the optical quantities, light transmission ($T_L$), reflection on the glass side ($R_g$) and on the layers side ($R_c$), absorption, etc. are determined for a 4 mm thick clear glass sheet using a D65 normalized illuminant at a solid angle of 2°. The colorimetric quantities L*, a*, b* are expressed in the CIELab system, also for an illuminant D65, 10°, the measurement being carried out at an angle of 8° with respect to the normal to the glass sheet.

The application of the enamel composition is conventionally carried out by a screen printing technique. The application having been carried out, the composition is baked in order to form the enamel layer. This "baking" is either a one-stage baking or a two-stage baking. In the second case, that most often followed in the production of laminated glass panels, a first baking results in the removal of the solvents, which temporarily stabilizes the printed pattern, and a second baking results in the melting of the frit present in the composition. These two stages generally correspond to two moments in the preparation of the glass panels. The first is carried out on the sheet on which the composition is applied and the second advantageously corresponds to the bending heat treatment.

In laminated glass panels, in particular windshields, the masking enamel is necessarily applied at least to the sheet directed toward the outside of the vehicle. The system of heated layers is also advantageously applied to this sheet in order to optimize the heating necessary for the deicing which constitutes the operation that requires the most power. The busbars are positioned on the system of conductive layers facing the enameled regions. All these elements are located on the face of the sheet in contact with the thermoplastic interlayer, the face 2 in the conventional designation which numbers the faces of the sheets from the outside.

The inventors have analyzed the behavior of the system of conductive layers positioned on a conventional strip of masking enamel. They have shown that the power delivered to the busbars was at best only partly transmitted to the conductive layers located on the viewing area of the windshield. This results in a loss of power harmful to the heating performances of the glass panel. The study of the origin of this loss of power has made it possible to identify certain factors which, when taken into account, can result in an improvement in these performances.

The invention results from this identification and from the way of overcoming the causes of this loss of power. The invention is the subject matter of claim 1, which relates to the influence of the application of the system of conductive layers to the masking strips and proposes an alternative to the conventional enamel strips.

One identified cause of the loss of useful electrical power for heating the glass panel is linked to the difficulty in ensuring a perfect continuity of the conductive layers at the edge of the masking strip. This difficulty is mainly due to the thickness of the enameled strip. The thickness of the conductive layers is much smaller than that of the enameled strip. At the edge of the enameled layer, the conductive layers must cross, without discontinuity or significant reduction in their cross section, the threshold which is several tens, or even several hundreds, times their thickness. The enameled strips have a thickness of the order of 20 to 150μ, the thickness of the systems of conductive layers, even the most complex ones, is of the order of 0.3-0.4μ.

The replacement according to the invention, as claimed, of the enameled strips by an opaque strip formed by thin layers makes it possible to minimize this threshold effect and the defects that result therefrom.

The thin layers used on glass substrates have multiple applications. The most usual ones target the solar control and in particular the control of the energy transmissions by a selective reflection of the infrared rays. Thin layers are also commonly used as conductive electrodes. Other layers are used to minimize the reflection of the glass panels, etc. The requirements as regards the use as a masking strip do not correspond to those of the previous applications.

Previously, glass panels coated with layers leading to a low light transmission have been proposed. Publication WO 2012/095380 thus proposes motor vehicle roofs, the light transmission of which may reach values as low as 5%. The composition of the layers proposed in this document generally comprises one or more absorbent metal layers, in particular that absorb in the visible wavelength range, and dielectric layers that are essentially transparent, which have the role of protecting the metal layers.

The distinctive feature of the masking strips according to the invention, and therefore of the layers that form them, is that of having a complete, or virtually complete, opacity. The light transmission should be at most 1% and preferably does not exceed 0.5%, and particularly preferably at most 0.1%. This property is the opposite of that required in numerous applications in which it is endeavored, on the contrary, to maintain a visible range transmission that is as high as possible.

The advantage of the thin layers deposited by cathode sputtering is that these layers remain relatively thin while resulting in the required opacity. The systems of layers according to the invention have a total thickness which is not greater than 4000 Å, and preferably not greater than 3000 Å.

The systems of layers used according to the invention for forming the masking strips comprise at least one absorbent/reflective layer of a metal or alloy is from the group comprising: W, Cr, Ta, Al, Cu, Nb, Zr, Ti, Mo, V, Hf and NiCr, NbCr, CoCr, ZrCr, NiCrW and stainless steels; and optionally also the absorbent compounds formed from these metals, in particular the at least partially nitrided compounds.

Among the metals and alloys, those that are preferred are Cr, Zr, W, Al and alloys thereof.

Schematically, the structure of the system of layers used corresponds to the form:

G/ . . . M1/ . . .

G being the glass sheet, M1 the absorbent/reflective layer, the systems comprising other elements which are mentioned subsequently.

The absorbent layer may be composed of several "partial" absorbent layers from the list indicated above of the type:

G/ . . . M1(M1$_a$/M1$_b$/M1$_c$) . . . / . . .

Furthermore, in the most common applications, the manufacturers demand that these masking strips have a reflection toward the outside that is as low as possible. They should be as discreet as possible, and should not transform into "mirrors". The reflection in the visible region is thus preferably less than 8% on the glass side ($R_g$). Preferably, this reflection is not greater than 5%.

The manufacturers generally prefer for these masking strips to remain without "colored appearance". The light reflected by the portions of the glass panel coated with these masking layers has as neutral a color as possible. In colorimetry, this condition is expressed for example by the fact that the coordinates a* and b* of the CIELab system are close to 0. The portions of the glass panel thus coated give a substantially black and matte appearance. But it is possible, without departing from the invention, to give the masking strips a certain coloration at the request of the manufacturers. This coloration will appear more, the more intense the reflection.

The opaque strips should also have a high resistance to heat treatments. The glass panels considered are practically all subjected to bending or tempering operations carried out at temperatures of the order of 650° C. to 700° C. for about 10 minutes. It is necessary for the properties of the masking strips not to be impaired at the end of the treatment and, for example, not to present iridescence. Where appropriate, in order to improve the resistance of this absorbent layer, it is possible to affix thereto thin layers described as "sacrificial" or "barrier" layers, the sole role of which is to protect the absorbent layer. The structural layout is then of the type:

G/ . . . B1/M1/B2 . . .

The barrier layers B1 and B2 are used simultaneously or individually, and may be identical or different. They are usually layers formed in a known manner in order to protect the functional layer against any impairment, in particular by oxidation.

According to the invention, the layers used to act as masking may advantageously combine the mechanisms of absorption on the one hand and of reflection/interference on the other hand.

Although generally the absorption increases with the thickness of the layer M1, the reflection also increases with this thickness. Consequently, in order to meet the requirements indicated previously, it is necessary to find the best compromise by playing with numerous factors. These are the choice of the nature of the layers, and of their thickness for the absorbent and reflective materials, but also of those of the dielectric layers which, with the absorbent/reflective layers, determine the optical interferences that make it possible to minimize the reflections.

The absorbent/reflective layers for leading to a good absorption without excessively increasing their thickness, advantageously have an extinction coefficient k, determined for the arithmetic mean of the values for the wavelengths of the visible range (350-750 nm), which is not less than 2.5, and preferably not less than 3.

In order to form a virtually complete obstacle to the light transmission, the absorbent and reflective layers have thicknesses ordinarily greater than those of the layers previously proposed. In the publication indicated above, the examples provided have absorbent layers, the thickness of which does not exceed 250 Å. Preferably, the masking strips according to the invention comprise at least one absorbent/reflective layer, the thickness of which, depending on the nature of these layers, is not less than 300 Å, and preferably not less than 400 Å.

The chosen thickness is a function of the nature of the metal layer and therefore its extinction coefficient. For the least absorbent layers, the tendency is therefore to increase the thickness. This increase may result in a large proportion of reflection. Preferably, in order to limit this tendency, the absorbent/reflective metal layers have a thickness which is not greater than 900 Å, and preferably not greater than 800 Å.

One of the difficulties resolved according to the invention is to manage to reconcile a very high absorption with a limited reflection toward the outside. As indicated previously, the increase in the thickness of the absorbent layer inevitably leads to an increase in the reflection. Under these conditions, in order to arrive at products that meet the stated conditions, it is necessary to optimize the choice of materials, that of the thicknesses used, and the use of arrangements that enable a better control of the reflection in particular by acting on optical interferences established by combinations of layers.

The latter point advantageously leads to the use of a second absorbent/reflective layer, M2, of the same nature or of different nature with respect to the main absorbent/reflective layer M1 mentioned above. This second layer in the system of layers constituting the masking strip is located between the glass sheet to which the masking strip is applied and the absorbent/reflective layer mentioned above. The structure of this system is illustrated in this way:

G/ . . . /M2/ . . . /M1/ . . .

This second layer, M2, one role of which is to limit the reflection, may have distinctive features different from those of the first absorbent/reflective layer, M1. Although the same metal materials may be used, namely: W, Cr, Ta, Al, Cu, Nb, Zr, Ti, Mo, V, Hf and NiCr, NbCr, CoCr, ZrCr, NiCrW and stainless steels, and the partially or completely nitrided compounds derived from the preceding materials. The latter offer the distinctive feature, like metals, of a certain conductivity even if this conductivity is substantially lower.

This layer M2, like the layer M1, may be composed of several partial layers.

The features of this second layer M2 differ substantially from those of the first absorbent/reflective layer M1. The extinction coefficient may be substantially lower, and the thickness also smaller. Preferably, this second layer M2 which makes it possible to reduce the reflection has a thickness which is between a third and a tenth of the thickness of the first absorbent/reflective layer M1.

The features of this second layer, the properties of which depend on multiple factors as indicated previously, may also be expressed relative to the values of the product of the extinction coefficient k (average of the coefficients over the visible wavelength range), of the refractive index n and of the thickness of the layer e expressed in Angströms. This product, k·n·e, is preferably at least equal to 300 and particularly preferably at least equal to 400.

Independently of their optical features, among the metals and alloys of M1 and optionally of M2 (when M2 is a metal or alloy) those which are not very sensitive to the heat treatments capable of modifying the properties thereof are preferred. If metals very sensitive to oxidation, such as titanium, are used, they are preferably protected by barrier layers, as indicated previously, or in the form of a more resistant alloy.

Among the most resistant combinations are the alloys based on Ni, Cr, Zr, Nb and W such as NiCr, ZrCr, NbZr, NiCrW and stainless steels in particular Inconel.

According to the invention, one particularly preferred alloy is based on tungsten and nickel. The tungsten represents at least 40%. Advantageously, this alloy additionally comprises chromium.

The system of layers forming the masking strips also comprise dielectric layers that contribute in particular to establishing interference systems that limit the reflection. As for the absorbent layers, each of the dielectric layers may comprise several partial layers.

A first dielectric layer is advantageously applied directly in contact with the glass sheet.

G/D1/ . . .

This layer may intervene in various ways, on the one hand as protection for the layers that are superposed thereon by forming a barrier to the diffusion of ions originating from the glass sheet during heat treatments. In this role, layers such as $SiO_2$ that are known to form an effective obstacle to migration may be used. The low refractive index of $SiO_2$ means that this layer does not participate in limiting the reflection. To ensure that the layer participates significantly in the "de-reflection", the dielectric layer D1 should have, in a known manner, a refractive index greater than that of the glass sheet to which it is applied. Its index is therefore advantageously greater than 1.5 and preferably greater than 1.7. Preferred dielectric layers are in particular $Si_3N_4$, $SiO_xN_y$, AlN, $SnO_2$, ZnSnO, $TiO_2$. Depending on the system, the thickness of D1 advantageously lies between 200 and 700 Å.

Preferably, a structure of the system of layers according to the invention corresponds to the following layout:

G/D1/M2/D2/M1 . . .

D2 may be of the same nature or of different nature with respect to that of D1. In addition to the materials indicated above, conventional transparent dielectrics can be used: $SiO_2$, $TiO_2$, ZnO, $Al_2O_3$, $SnO_2$, ITO, ZnSnO, etc.

The layer D2 is essentially intended for the role of limiting the reflection. Its thickness and its refractive index are determined by this role. It lies at around 200-900 Å, and preferably between 300 and 800 Å.

The systems of layers may also comprise a dielectric layer D3, superposed on the layer M1 for the main purpose of protecting the system that results in the system:

G/D1/M2/D2/M1/D3

The protection of D3 is firstly of mechanical type, the sheets comprising these masking strips, once included in the laminated glass panel, being in fact protected against external hazards. This mechanical protection takes into account the risks during the handling operations and storage preceding the formation of the laminate. This dielectric layer also intervenes to protect the systems of layers during heat treatment operations. In these roles, the dielectric layer D3 is advantageously a hard layer, in particular layers of nitrides and its thickness may take very varied values. This thickness is preferably at least 100 Å.

In one particular embodiment of the invention, the system of layers may optionally have no dielectric layer D2 between the two absorbent/reflective layers. The system then corresponds to the following structure:

G/D1/M2/M1/D3

The reason why this type of structure is capable of resulting in all of the desired properties, in particular in a limited reflection, probably stems from the presence of a compound M2 which satisfies the requirements both of the absorbent/reflective layers and the dielectric layer, attributed to the layer D2 in the structures comprising such a layer.

The invention is described in detail subsequently with reference to the figures, in which:

FIG. 1 illustrates the arrangement on one of the glass sheets of the elements occurring in a glass panel comprising a system of heated layers;

FIG. 2 illustrates the edge of a heated laminated glass panel.

In these figures, the ratio of the dimensions is not respected for convenience of interpretation.

FIG. 1 shows the arrangement of the components of a layered heating assembly on a glass sheet of a glass panel such as a windshield.

The glass sheet 1 comprises a masking strip 4 located on the edge of the sheet. This strip is intended to hide the unattractive elements, in particular the busbars 6 powering a system of conductive layers 5 that extends both over the masking strip and directly over the glass sheet.

FIG. 2 presents a laminated glass panel that incorporates a glass sheet and the functional components borne by the sheet as represented in FIG. 1.

The glass panel comprises two glass sheets 1, 2 assembled by means of a thermoplastic interlayer sheet 3 of polyvinyl butyral (PVB) or ethylene-vinyl acetate (EVA) type. The elements of the heating system are all applied to the face of the glass sheet directed toward the interlayer sheet. The glass sheet 1 is the one in contact with the outside atmosphere. This arrangement is preferred insofar as the heated layer is in immediate contact with the sheet that is directly exposed to the atmospheric hazards. Considering the low thermal conductivity of the various glass and interlayer sheets, the transmission of heat in this arrangement takes place under the best possible conditions.

In addition to the masking strip 4, the sheet 1 bears the system of heated layers 5 and a supply collector (busbar) 6. The glass/masking strip/heated layer/busbar sequence is controlled by the role of each of these elements. The system of layers 5 is necessarily in contact with the busbar 6, and this busbar must be masked by the strip 4. In this arrangement, the heated layers applied to the masking strip extend the portion of this layer that is directly in contact with the glass sheet 1. Passing from the masking strip 4 to the glass sheet 1, the layer must cross the edge of the masking strip without discontinuity or lack of homogeneity to enable the highest possible transmission of the electrical power communicated by means of the busbar 6.

In the conventional mode, the differences in thickness between that of the conductive layers 5 and of the enameled masking strip 4 compromise the continuity of the conductive layers along this threshold.

The choice of forming the masking strip 4 from layers having a thickness which is of the order of magnitude of that of the conductive layers significantly reduces the defects observed with the enamel strips.

A comparison is carried out between a glass panel, the masking strips of which are produced by screen printing of enamel in a conventional manner, and a glass panel, the masking strip of which is obtained by cathode sputtering according to the invention.

In both cases, the support is formed of a clear glass sheet with a thickness of 2.1 mm. The conductive layers are as described in the publication WO 2011/147875. They comprise three silver layers. The total thickness of the layers varies slightly depending on the assemblies proposed, remaining of the order of 4000 Å. As a general rule, the total thickness of the systems of conductive layers is not greater than 0.6μ.

Under the conditions of the test, the measurement of the resistance of the layer on the glass alone becomes established at 0.80Ω/□. On the enamel masking strip produced by conventional screen printing, this resistance is measured at 320Ω/□, and that of the conductive layer applied to the enamel strip is of the order of 4 Ω/□.

The conduction of the layers applied to the enamel strips is therefore substantially impaired due in particular to the considerable roughness of the enamel layers. This difficulty is nevertheless much less detrimental than that corresponding to the passage of the conductive layers from the enamel strip to the glass sheet. The resistance measurement at the threshold of the enamel strip is at best not less than 5Ω/□, but in places may rise without limit when the conductive layers are broken along this threshold.

In a first test according to the invention, a masking strip formed of the following successive layers is formed, the thicknesses between parentheses are expressed in Ångströms.

Glass/$Si_3N_4$ (563)/NiCrW (72)/$Si_3N_4$ (500)/NiCrW (500)/$Si_3N_4$ (500)

This system is applied by magnetron cathode sputtering under conventional conditions using metal cathodes, in an argon atmosphere for the metal layers and in a nitrogen atmosphere for the formation of the silicon nitrides.

The total thickness of the system of layers of the masking system is 2135 Å, i.e. 0.2135μ, in comparison with the customary thicknesses of the screen-printed enamel layers which are of the order of 20 to 150μ. The masking strip obtained by cathode sputtering has a thickness comparable to that of the system of conductive layers. The "threshold" at the boundary of this masking strip is quite unlike the threshold corresponding to conventional enamels. The continuity of the conductive layers is better ensured. In this case, the measurement of the resistance of the conductive layers is substantially the same whether it is measured on the masking strip, on the glass sheet or else on a portion forming the transition between the masking strip and the portion without this strip. The measurement in all cases is 0.78Ω/□, analogous to that measured in the previous case as regards the resistance of the conductive layer on the glass.

The glass panel coated with the masking strip furthermore offers a practically neutral black appearance, a transmission at this strip which is less than 0.5% and a reflection on the glass side of 4.3%. The colorimetric indices are a* 0.1 and b* −0.3.

In the absence of the de-reflective layer M2, the optical results are substantially modified. The measurements are carried out on the following system of absorbent layers:

Glass/$Si_3N_4$ (50)/NiCrW (500)/$Si_3N_4$ (500)

For this assembly the transmission is slightly higher. It becomes established at 2.2%. But above all the reflection in the absence of the second metal layer increases significantly, $R_g$ rises to 25.5%, and at the same time the reflection is less neutral, a* 3.1 and b* 0.8.

Various tests are undertaken by varying the nature of the layers, their thicknesses and the structure of these assemblies.

1. In the G/D1/M2/D2/M1/D3 structure, the nature of M1 is varied.

|   | G | D1 | M2 | D2 | M1 | D3 | $T_L$ | $R_g$ | a* | b* | k (M1) |
|---|---|---|---|---|---|---|---|---|---|---|---|
| 1 | G | $Si_3N_4$ 564 | NiCrW 71 | $Si_3N_4$ 502 | NiCrW 638 | $Si_3N_4$ 500 | 0.2 | 4.3 | 0 | −0.3 | 3 |
| 2 | G | $Si_3N_4$ 300 | NiCrW 566 | $Si_3N_4$ 476 | NiCrW 83 | $Si_3N_4$ 446 | 0.24 | 32 | 0.3 | 10.5 | 3 |
| 3 | G | $Si_3N_4$ 588 | NiCrW 87 | $Si_3N_4$ 523 | Al 340 | $Si_3N_4$ 500 | 0.2 | 4.4 | 0.1 | −0.1 | 6.6 |
| 4 | G | $Si_3N_4$ 564 | NiCrW 69 | $Si_3N_4$ 564 | Ti 940 | $Si_3N_4$ 564 | 0.2 | 4.3 | 0 | −0.3 | 2.6 |
| 5 | G | $Si_3N_4$ 553 | NiCrW 59 | $Si_3N_4$ 496 | CrN 1315 | $Si_3N_4$ 500 | 0.2 | 4.3 | 0 | −0.45 | 1.8 |

For tests 1, 3, 4, the desired properties are satisfied: very low transmission, limited reflection and neutrality of color. Depending on the value of the extinction coefficient, the thickness of M1 is greater or smaller. The higher k is, the thinner M1 is.

Example 2 shows the importance of the relative position of M1 and M2. In this test, the thickest absorbent/reflective layer is closest to the glass sheet. It is observed that if the absorption remains very high, the reflection is not suitably attenuated on the glass sheet side. Conversely, on the layer side, the reflection not indicated in the table remains low, of the order of 4%.

Starting from the preceding observation, if the reflection should be low both on the glass side and on the layer side, a structure comprising three absorbent layers may be used which corresponds to:

G/D1/M2/D2/M2/D3/M3/D4

By way of example, the following assembly is prepared:

G/Si$_3$N$_4$(567)/NiCrW(72)/Si$_3$N$_4$(508)/NiCrW(434)/Si$_3$N$_4$(448)/NiCrW(84)/Si$_3$N$_4$(483)

For this assembly, the reflection properties are those obtained previously, separately in examples 1 and 2.

Example 5 involves a material (CrN) of conductive nature but that has a reduced conduction with respect to a metal or metal alloy. The extinction coefficient of this material is markedly lower (1.8) than for metals and alloys. To achieve comparable performances, it is necessary to substantially increase the thickness of the corresponding layer.

2. In these tests, the nature of M2 is varied.

|    | G | D1 | M2 | D2 | M1 | D3 | T$_L$ | R$_g$ | a* | b* | k (M2) |
|----|---|----|----|----|----|----|-------|-------|-----|------|--------|
| 6  | G | Si$_3$N$_4$ 559 | W 90 | Si$_3$N$_4$ 395 | NiCrW 646 | Si$_3$N$_4$ 500 | 0.2 | 4.3 | 0 | −0.3 | 3.6 |
| 7  | G | Si$_3$N$_4$ 497 | Ti 145 | Si$_3$N$_4$ 609 | NiCrW 648 | Si$_3$N$_4$ 500 | 0.2 | 4.4 | 0.1 | −0.1 | 2.6 |
| 8  | G | Si$_3$N$_4$ 479 | Al 34 | Si$_3$N$_4$ 819 | NiCrW 668 | Si$_3$N$_4$ 500 | 0.4 | 10.6 | 4.2 | −1.7 | 6.1 |
| 9  | G | Si$_3$N$_4$ 408 | Cu 95 | Si$_3$N$_4$ 785 | NiCrW 691 | Si$_3$N$_4$ 500 | 0.3 | 13.5 | 11.8 | −5 | 3.2 |
| 10 | G | Si$_3$N$_4$ 501 | Cr 101 | Si$_3$N$_4$ 684 | NiCrW 655 | Si$_3$N$_4$ 500 | 0.2 | 4.5 | 0 | −0.2 | 3.6 |
| 11 | G | Si$_3$N$_4$ 467 | CrN 159 | Si$_3$N$_4$ 274 | NiCrW 659 | Si$_3$N$_4$ 500 | 0.2 | 4.3 | 0 | −0.22 | 1.8 |
| 12 | G | Si$_3$N$_4$ 450 | TiN 291 | Si$_3$N$_4$ 374 | NiCrW 646 | Si$_3$N$_4$ 500 | 0.2 | 4.9 | 0.4 | −0.2 | 1.2 |
| 13 | G | Si$_3$N$_4$ 557 | AZO 1609 | Si$_3$N$_4$ 1264 | NiCrW 707 | Si$_3$N$_4$ 500 | 0.2 | 8.85 | 0.8 | 0.28 | 0.2 |
| 14 | G | Si$_3$N$_4$ 398 | ZrN 250 |  | NiCrW 755 | Si$_3$N$_4$ 500 | 0.26 | 6 | 0 | −0.5 | 0.5 |
| 15 | G | Si$_3$N$_4$ 510 | TaN 79 | Si$_3$N$_4$ 99 | NiCrW 774 | Si$_3$N$_4$ 500 | 0.21 | 5.3 | 0.98 | −0.5 | 1.1 |

For the low k coefficients, the thickness of M2 should be increased in order to try to re-establish the preferred conditions according to the invention. This is also the result expressed by the product n·k·e that appears on the next table. If this product is too small, the reflection is relatively high. This is the case for example for aluminum (8) or copper (9). The significant increase in the thickness may compensate for the very low extinction coefficients like for AZO (14).

|    | n   | k   | e    | n.k.e |
|----|-----|-----|------|-------|
| 8  | 0.9 | 6.1 | 34   | 182   |
| 7  | 1.9 | 2.6 | 145  | 740   |
| 9  | 0.9 | 3.2 | 95   | 280   |
| 12 | 2.1 | 1.4 | 291  | 848   |
| 14 | 2.7 | 0.2 | 1609 | 809   |
| 10 | 1.8 | 3.6 | 101  | 662   |
| 11 | 3.1 | 1.8 | 159  | 877   |
| 16 | 5.2 | 1.1 | 79   | 458   |
| 6  | 3.5 | 2.7 | 90   | 830   |
| 15 | 3.2 | 0.5 | 250  | 385   |

3. Impact of D1.

|    | G | D1 | M2 | D2 | M1 | D3 | T$_L$ | R$_g$ | a* | b* | n (D1) |
|----|---|----|----|----|----|----|-------|-------|-----|------|--------|
| 16 | G | TiO$_2$ 436 | NiCrW 104 | Si$_3$N$_4$ 578 | NiCrW 615 | Si$_3$N$_4$ 500 | 0.18 | 4.9 | 0.3 | −0.15 | 2.5 |
| 17 | G |  | NiCrW 51 | Si$_3$N$_4$ 494 | NiCrW 597 | Si$_3$N$_4$ 500 | 0.35 | 6.7 | 5.9 | −0.47 |  |
| 18 | G | SiON 693 | NiCrW 41 | Si$_3$N$_4$ 514 | NiCrW 675 | Si$_3$N$_4$ 500 | 0.2 | 5 | 2.6 | −0.2 | 1.75 |

The absence of layer D1 leads to an increased reflection.

4. Impact of the index of D2.

| | G | D1 | M2 | D2 | M1 | D3 | $T_L$ | $R_g$ | a* | b* | n (D2) |
|---|---|---|---|---|---|---|---|---|---|---|---|
| 19 | G | Si$_3$N$_4$ 569 | NiCrW 58 | TiO$_2$ 374 | NiCrW 684 | Si$_3$N$_4$ 500 | 0.2 | 4.6 | 0.3 | −0.1 | 2.5 |
| 20 | G | TiO$_2$ 422 | NiCrW 99 | TiO$_2$ 405 | NiCrW 644 | Si$_3$N$_4$ 500 | 0.2 | 4.7 | 0.1 | −0.2 | 2.5 |
| 21 | G | Si$_3$N$_4$ 543 | NiCrW 82 | SiO$_2$ 801 | NiCrW 556 | Si$_3$N$_4$ 500 | 0.2 | 4.3 | 0 | −0.35 | 1.5 |

The play in the thickness and in the index makes it possible to achieve the interference conditions that result in the desired conditions with various materials.

Example 15 from the previous table shows that in particular combinations of material M2, in this case of ZrN, the absence of specific dielectric layer does not stand in the way of obtaining satisfactory results.

The examples presented show the great diversity of the combinations forming systems of layers that are capable of forming appropriate masking strips. The choice of a system under these conditions is a function of additional considerations such as the ease of production of these layers.

The formation of the masking strips only coats a small portion of the surface of the glass panels. The cathode sputtering techniques necessitate masking the portions of the glass panel that should not be coated. Solid masks may be applied to the glass sheets during the deposition of the opacifying strips. The preparation of the glass panels in question preferably goes through the application of protective films to the zones that should not be coated, which films are then removed for the application of the conductive layers A technique of this type is described for example in the publication WO 03/080528.

The invention claimed is:

1. A laminated motor vehicle glass panel comprising:
   first and second glass sheets united by a thermoplastic interlayer sheet;
   a system of conductive layers applied to a first face of the first glass sheet, wherein the first glass sheet has a reflection which is not greater than 8% on a second side of the first glass sheet opposite the first side of the first glass sheet when the first glass sheet is 4 mm thick;
   an opaque masking strip, in contact with the first glass sheet on an edge of the first glass sheet, forming an interference optical system for at least partially neutralizing overall reflection on the first side of the first glass sheet, the opaque masking strip including an assembly of layers including (a) a first absorbent/reflective layer, (b) a second absorbent/reflective layer located between the first face of the first glass sheet and the first absorbent/reflective layer, and (c) plural dielectric layers, wherein at least part of the opaque masking strip is covered by the system of conductive layers, and wherein a thickness of the second absorbent/reflective layer is between a third and a tenth of a thickness of the first absorbent/reflective layer; and
   electrical supply busbars in contact with the system of conductive layers where the at least part of the opaque masking strip is covered by the system of conductive layers,
   wherein the assembly of layers of the opaque masking strip absorb visible radiation and is formed by cathode sputtering such that visible light transmission through the opaque masking strip is at most 1%,
   wherein the second absorbent/reflective layer is made of metal or based on a metal compound, and the second absorbent/reflective layer comprises (1) a metal from a selected metal group, the selected metal group consisting of: W, Cr, Ta, Nb, Zr, Ti, Nb, Mo, V, Hf and NiCr, CoCr, ZrCr, NbCr and NiCrW, and stainless steels, (2) an alloy of metals from the selected metal group, (3) a partially nitrided compound of at least one metal from the selected metal group, (4) a completely nitrided compound of metal from the selected metal group, (5) a partially nitrided compound of at least one alloy including a metal from the selected metal group, or (6) a completely nitrided compound of at least one alloy including a metal from the selected metal group.

2. The glass panel according to claim 1, wherein the opaque masking strip is applied to a 4 mm thick clear glass sheet.

3. The glass panel according to claim 1, wherein the assembly of layers of the opaque masking strip has a total thickness which is not greater than 4000 Å.

4. The glass panel according to claim 1, wherein the first absorbent/reflective layer is made of metal or based on a metal compound, and the first absorbent/reflective layer comprises (1) a metal from an extended metal group consisting of the selected metal group, Al and Cu, (2) an alloy of metals from the extended metal group, (3) a partially nitrided compound of at least one metal from the extended metal group, (4) a completely nitrided compound of metal from the extended metal group, (5) a partially nitrided compound of at least one alloy including a metal from the extended metal group, or (6) a completely nitrided compound of at least one alloy including a metal from the extended metal group.

5. The glass panel according to claim 4, wherein the first absorbent/reflective layer has an extinction coefficient k, which is an average of coefficients over a visible wavelength range, 350-750 nm, which is not less than 2.5.

6. The glass panel according to claim 4, wherein the first absorbent/reflective layer has a thickness which is not less than 300 Å.

7. The glass panel according to claim 6, wherein the first absorbent/reflective metal has a thickness which is not greater than 1000 Å.

8. The glass panel according to claim 1, wherein the second absorbent/reflective layer is such that a product (k•n•e) of a refractive index (n) of a material of the second absorbent/reflective layer, (2) a value of an extinction coefficient (k), which is an average of coefficients over a visible wavelength range, 350-750 nm, and (3) a thickness (e) of the second absorbent/reflective layer expressed in Angstroms is at least 300.

9. The glass panel according to claim 1, wherein the plural dielectric layers are transparent.

10. The glass panel according to claim 9, wherein a first dielectric layer of the plural dielectric layers is directly applied to the first glass sheet and has a refractive index of greater than 1.5.

11. The glass panel according to claim 9, wherein the plural dielectric layers are $Si_3N_4$, $SiO_xN_y$, AlN layers.

12. The glass panel according to claim 1, wherein the opaque masking strip has a structure $G/D_1/M_2/D_2/M_1/D_3$, wherein $M_1$ and $M_2$ are respectively the first and second absorbent/reflective layers, and $D_1$, $D_2$, $D_3$ are dielectric layers of the plural dielectric layers, the layer $D_3$ essentially having a role of mechanically and/or chemically protecting the underlying layers.

13. The glass panel according to claim 1, wherein the first absorbent/reflective layer is a layer formed of an alloy that comprises, by weight, at least 40% of tungsten.

14. The glass panel according to claim 13, wherein the first absorbent/reflective layer further comprises chromium.

15. The glass panel according to claim 13, wherein the second absorbent/reflective layer is of a same nature as that of the first absorbent/reflective layer.

16. The glass panel according to claim 1, wherein the system of conductive layers is formed by cathode sputtering and comprises an assembly of metal layers and of dielectric layers, the assembly of metal layers and of dielectric layers having a thickness which is not greater than 4000 Å.

17. The glass panel according to claim 1, wherein the opaque masking strip has a visible light transmission through the opaque masking strip of at most 0.5%.

18. The glass panel according to claim 1, wherein the opaque masking strip has a visible light transmission through the opaque masking strip of at most 0.1%.

* * * * *